United States Patent [19]

Kuhn

[11] 3,969,168

[45] July 13, 1976

[54] METHOD FOR FILLING GROOVES AND MOATS USED ON SEMICONDUCTOR DEVICES

[75] Inventor: Gregory L. Kuhn, Tempe, Ariz.

[73] Assignee: Motorola, Inc., Chicago, Ill.

[22] Filed: Nov. 29, 1974

[21] Appl. No.: 528,363

Related U.S. Application Data

[62] Division of Ser. No. 446,834, Feb. 28, 1974, Pat. No. 3,892,608.

[52] U.S. Cl. .................................. 156/17; 427/85; 427/93; 427/95; 427/240; 357/49
[51] Int. Cl.² ........................................ H01L 21/306
[58] Field of Search .................. 427/85, 93, 240; 357/49, 50; 156/17

[56] References Cited
UNITED STATES PATENTS

| | | | |
|---|---|---|---|
| 3,432,792 | 3/1969 | Hatcher | 357/49 X |
| 3,632,434 | 1/1972 | Hutson | 427/240 X |
| 3,738,883 | 6/1972 | Bean et al. | 357/49 X |
| 3,772,577 | 11/1973 | Planey | 357/50 X |
| 3,789,023 | 1/1974 | Ritchie | 148/186 X |
| 3,806,771 | 4/1974 | Petruzella | 357/49 |
| 3,832,202 | 8/1974 | Ritchie | 106/287 |
| 3,892,608 | 7/1975 | Kuhn | 148/188 |

OTHER PUBLICATIONS

Berenbaum, IBM Tech. Discl. Bull., vol. 11, No. 12, May 1969, p. 1706.

Primary Examiner—Ralph S. Kendall
Attorney, Agent, or Firm—Willis E. Higgins; Harry M. Weiss

[57] ABSTRACT

A process is disclosed for filling grooves, moats, and channels formed by both channel and anisotropic etching techniques. Basically the process is a two-step process to be performed on a wafer in which a channel and/or a moat has been formed. A P+ (boron) doped oxide is placed in the grooves or moats using spinon techniques followed by a uniform deposition of polycrystalline silicon over the entire wafer. Due to the spinning effects the P+ doped oxide is collected mostly in the grooves or moats. The P+ doped oxide that remains outside of the grooves and/or moats is removed using standard photolithographic procedures. The wafer is now heated to a temperature sufficient to drive the boron impurities from the P+ doped oxide into the polycrystalline silicon. A portion of a polycrystalline silicon now becomes heavily P+ doped. The remaining polycrystalline silicon remains undoped. The wafer is then etched by an etchant which effectively stops when the material being etched is highly P+ doped. In this manner a portion of the remaining undoped polycrystalline material is removed and the highly doped polycrystalline material is left in the channels and/or moats. The above can be repeated until the moats or channels are completely filled.

11 Claims, 2 Drawing Figures

METHOD FOR FILLING GROOVES AND MOATS USED ON SEMICONDUCTOR DEVICES

This is a division of application Ser. No. 446,834, filed Feb. 28, 1974, now U.S. Pat. No. 3,892,608.

BACKGROUND OF THE INVENTION

The forming of grooves in semiconductor surfaces is well known and has many established uses, one of which is for dielectric isolation. These grooves can be formed by channel etching or anisotropic etching as is well known in the art.

Usually in the prior art, the grooves are refilled by various layers of oxides, nitrides, polycrystalline material. Thereafter, the wafers are subjected to mechanical polishing to smooth out the surfaces and provide a planar surface into which active devices are formed. One of the problems in this process is the establishment of a planar surface at the point within the wafer that is desired. Techniques have been provided whereby carbide layers or nitride layers are formed at the various points within the wafer at which the polishing stops. The nitride or carbide layer is harder than the surrounding material and, the polishing becomes noticeably more difficult when such layer is exposed and the polishing therefore stops when the harder layer is exposed.

Such polishing back techniques have been the only techniques available for re-establishing the planarity of the wafer once the refill steps have been formed. However, these polishing techniques introduce additional problems. For example, the nitride and carbide layers are more difficult to form than an oxide layer. The oxide layer is formed by the oxidation of the semiconductor wafer itself or through chemical vapor deposition techniques which are more particularly known. The polishing back step is a very difficult procedure when the polishing must be accurate to within plus or minus a few microns.

SUMMARY OF THE INVENTION

The present invention relates to the manufacture of semiconductor devices and, more particularly, relates to the placement of an insulating material in an area of the semiconductor device which has been removed.

It is an object of the present invention to provide a process for filling a hole in a semiconductor surface with an insulating material.

It is another object of the present invention to provide a method for filling a groove formed in the surface of a semiconductor surface with an insulating material.

It is a still further object of the present invention to provide a method for filling a hole in a semiconductor wafer by a process which uses well known individual steps that are adapted for batch processing.

It is a further object of the present invention to fill a groove formed in a surface of a semiconductor wafer with an initial oxide layer formed in the groove using spin-on and differential etch techniques.

It is another object of the present invention to provide a process for filling a groove formed in the surface of a semicoonductor wafer with an insulating material and a polycrystalline silicon member and to re-establish a planar surface using chemical etching techniques rather than polishing back techniques.

It is a still further object of the present invention to provide a process for filling a groove with an insulating material which does not use silicon nitride as part of the process.

It is another object of the present invention to provide a method for filling a groove with an insulating material using a chemical, self-limiting etch back technique for exposing the surface.

It is a still further object of the present invention to provide a method for filling holes in any material which can withstand temperatures above 900°C on which an initial insulating layer can be formed.

It is a further object of the present invention to provide a method for filling holes in any material with a filler wherein the substrate is not etched by the etchant used to chemically remove the filler from unwanted areas covering the substrate.

These and other objects and features of this invention will become fully apparent in the following description of the drawings.

BRIEF DESCRIPTION OF THE INVENTION

Figure 1:
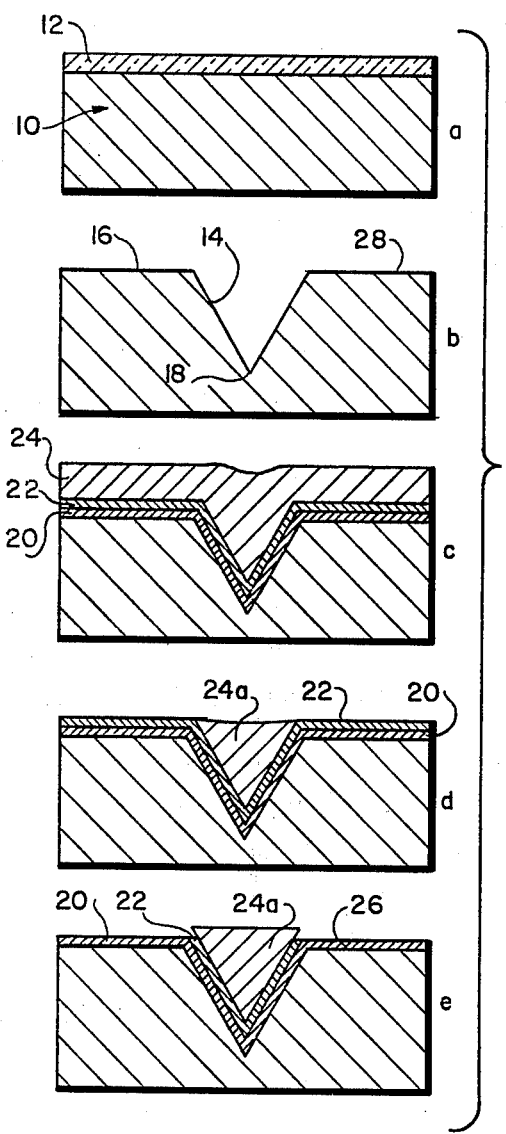
FIG. 1 shows the series of steps A through D showing a typical prior art process for filling a groove with a bulk insulating material.

The present invention is directed to a process for filling grooves, holes or other evacuated spaces on a semiconductor surface by using well known techniques designed to enhance the uniformity of such process. The uniformity is important because it is a direct measure of the number of good devices that can be made in the structure once the evacuated spaces have been refilled in the wafer and active devices are being fabricated.

It has been determined that the processing of a semiconductor wafer can be done in a more uniform manner when working with a substantially level surface. A level surface gives the following advantages: (1) masking layers and metallization layers which are put on at various points in the processing of the wafer can be more uniformly applied to a substantially level surface (2) the level surface avoids oxide steps and hence step coverage of metal and step coverage by other layers such as oxides, masking layers formed by chemical vapor deposition are more uniformly formed on a level wafer surface.

The method hereinafter disclosed uses the spin-on technique to deposit undoped oxide within the evacuated space on the wafer surface. Such space can be a groove, a channel or can be a hole of any shape formed at the surface of a substrate and extending into the substrate body. The surface of the substrate defining the evacuated space is covered with an initial oxide layer. The insulating characteristic of this method is provided by this initial oxide step. Thereafter, an undoped oxide is spun onto the wafer and because of the spinning action of the wafer, the undoped oxide settles primarily in the bottom of the evacuated space. Thereafter, a highly doped oxide is also spun onto the wafer surface. This highly doped oxide material is doped with boron atoms. This highly doped oxide again primarily settles in the bottom of the evacuated spaces on top of the undoped oxide. The P+ doped oxide and undoped spin-on oxide that remains outside of the grooves and-/or moats is removed using standard photolithographic procedures. Thereafter, the entire wafer surface is covered with a polycrystalline silicon layer which uniformly covers both the highly doped oxide sitting in the evacuated spaces as well as the other portions of the semiconductor wafer. Thereafter, the wafer is placed in an oven for driving the impurities from the highly doped oxide into the polycrystalline silicon material. The heating step is long enough so that a portion of the polycrystalline silicon material within the groove and/or moat is doped to essentially the same impurity level as this highly doped oxide layer. Thereafter, the wafer is placed in an etchant which is selective insofar as the etchant removes the undoped polycrystalline silicon and automatically stops its etching action with the highly doped polycrystalline silicon is reached. Normally the first time the process is run, i.e. application of the undoped oxide, heavily doped oxide, polycrystalline silicon material, baking and etching, does not entirely fill up the evacuated space. Accordingly, the above list of steps is repeated a sufficient number of times to fill up the evacuated space and provide a degree of surface leveling which is sought by the process engineer.

DETAILED DESCRIPTION OF THE INVENTION

Referring to FIG. 1 there can be seen a series of prior art steps used to fill a groove with an initial oxide layer and then insure the planarity of the wafer by filling the remaining groove with a bulk material. In Step A, there is shown a substrate 10 having a mask 12 positioned thereon. The substrate 10 can be any material such as silicon, germanium, sapphire, spinel or any other material in which an insulated groove is to be formed.

Referring to Step B, there is shown how the groove is established in the surface of the semiconductor substrate. The evacuated space 14 is formed from the one surface 16 of the substrate and extends into the substrate body to a point 18. While a pointed groove has been shown this could be a rounded channel or any other evacuated space formed in the substrate. Referring to Step C, there can be seen the sequentially formed layers required in the prior art process. An initial oxide layer 20 is formed over the substrate body including the evacuated space 14. This initial oxide layer provides the insulating aspect between the substrate itself and the other material used to fill the remaining portion of the evacuated space 14. A polishing stop layer 22 of silicon nitride is then formed over the silicon oxide layer. On top of this is formed a polycrystalline silicon layer 24.

While it would be possible to fill the evacuated space 14 entirely with a thermal oxide by the thermal oxidation of the substrate itself, this is not practical for the following reasons.

The depth of groove and/or moat required exceeds the practical limits for refilling the groove and/or moat by thermal oxidation. Also the time required at temperature seriously degrades the surface silicon's crystallinity. Therefore, any devices fabricated on the surface would be extremely susceptible to failure. The above invention allows one to refill grooves and/or moats that have a large surface area cross section. This type of groove and/or moat cannot be refilled by thermal oxidation technique.

In the event that a substrate is used which cannot be oxidized for forming an oxidation layer 22, chemical vaporization deposition techniques can be used to form an insulating layer over the substrate. The layer formed by chemical vapor deposition can be hardened by well known annealing techniques.

After the initial oxide layer 20 is formed a polishing back layer 22 is formed. The characteristics of this polishing stop layer 22 include the following. (1) It is significantly harder than the material which is formed thereover. (2) It has a different color such that during the etching back step, visual inspection will indicate when it is reached. The polycrystalline layer 24 is significantly less hard than the silicon nitride layer 22. Hence, during the polishing back technique the polycrystalline silicon material is easily removed and the etch stop layer 22 is uncovered.

Referring to FIG. D there can be seen the wafer after the polishing back step is finished. Here there is shown the complete removal of the polycrystalline layer 24 except for that portion 24A which is located in the evacuated space 14. Since the target surface is the oxide layer 20 the silicon nitride layer 22 is removed by a selective etch which does not attack the oxide layer 20. Referring to FIG. 6 it can be shown where the target surface 26 of the oxide layer 20 is exposed for additional processing. The polycrystalline silicon portion 24 and silicon nitride 22 then fills the evacuated space 14.

The above process has the following limitations and drawbacks. First, it uses a silicon nitride layer 22 as the polish back stop. In this manner, the hardness of the silicon nitride is substantially greater than that of the polycrystalline silicon material and the polishing essentially stops when the silicon nitride layer is exposed. However, the following limitations are present during this polishing back stop.

A planarity of less than 2-3 microns is required across a two inch wafer. Because silicon nitride is not a perfect polishing stop the surface planarity can easily exceed 2-3 microns. When this occurs the silicon substrate is exposed in one area while in another area the polycrystalline silicon layer covers not only the grooves and/or moats but the device area as well. Devices fabricated in these two areas will not function. The device yield is decreased accordingly.

Additionally, the formation of the silicon nitride layer is not 100% predictable and defects are caused during the formation of the silicon nitride layer.

Formation of silicon nitride layers of established thickness uniformity and density is still an art. The sensitivity of the layer formation on a repeatable basis at present exceeds standard production capabilities. Formation of a repeatedly uniform layer with respect to thickness and density is most readily obtained in a research environment.

In the event that an evacuated space 14 is to be filled totally with thermally grown oxide, the thermal growth would have to be at a temperature greater than 1200°C and the growth time would be a matter of hours rather than a matter of minutes. This exposure of the silicon material, especially the upper surface 28 as shown in Step B of FIG. 1, has a detrimental effect on the surface by causing dislocation faults and other imperfections of the surface in which active devices are latter formed.

Figure 2:
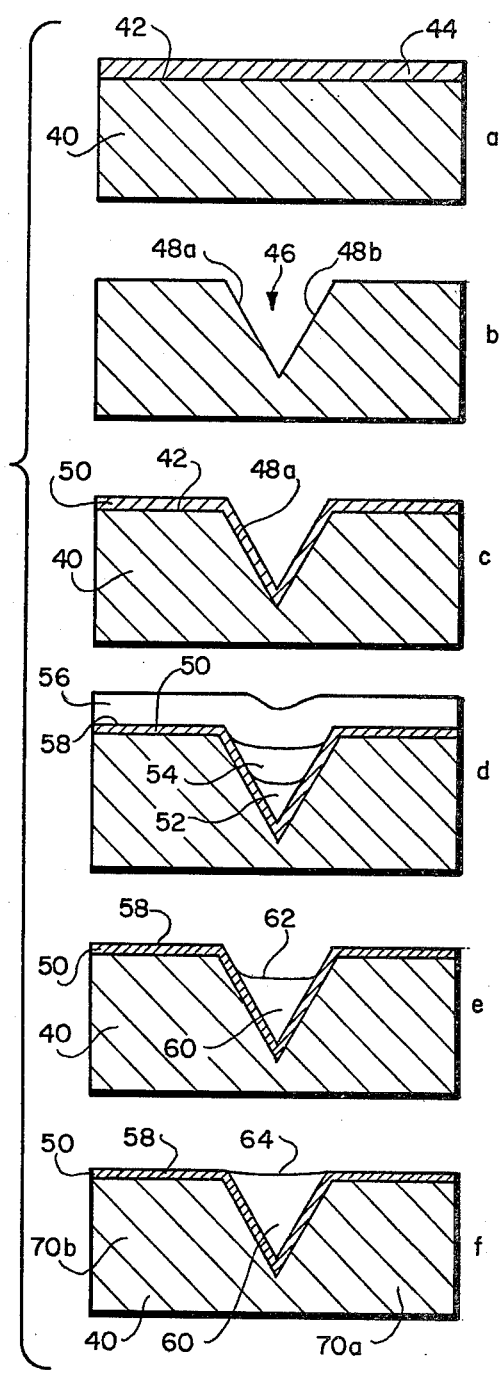
FIG. 2 shows the series of steps A through F of the present process in which a groove is filled with bulk insulating material.

Referring to FIG. 2, particularly Step A, there can be seen that starting substrate on which the present process will be performed. The substrate 40 has an upper surface 42 in which active devices are to be formed. A masking layer 44 is formed over the surface 42. A pattern, using standard photoresist techniques, is formed in the masking layer 44 and portions of the surface 42 are exposed which are etched using standard etching techniques for forming the evacuated space 46 shown in Step B. The evacuated space 46 is defined by the remaining internal surfaces 48 of the substrate itself. While a V groove is shown defined by the surfaces 48A and 48B a channel having a rounded bottom can also be formed as well as any rectangular evacuated space. While grooves running along the surface of the substrate are implied by the formation of the V etched groove, rectangular evacuated spaces can also be formed.

Referring to FIG. C, the substrate 40 is shown having an initial insulating layer 50 formed on the surface 42 of the substrate 40 as well as the internal surfaces 48A and 48B. This initial insulating layer 50 can easily be silicon dioxide which is thermally grown when a silicon substrate is employed. If a nonsilicon substrate is employed, the oxide layer can be formed by chemical vapor deposition and then hardened by standard annealing steps.

Referring to Step D a mask of undoped oxide 52 is shown which is placed in the evacuated space 48 by spin-on techniques and standard photoresist techniques completely described in a pending U.S. patent application Ser. No. 278,833, filed Aug. 8, 1972 entitled "Liquid Silica Source for Semiconductors". After the undoped oxide 52 is formed, a layer of doped silicon oxide 54 which is also formed in the evacuated space 48 by spin-on techniques, as described in U.S. Pat. No. 3,789,023, and standard photoresist techniques. While the method can also be practiced by only using doped silicon dioxide it has been found beneficial to use a two-step process for the following reasons.

This was brought about because the higher the viscosity of the spin-on glass the more readily the groove and/or moat would be refilled. It was found that undoped spin-on glass could be formed with a higher viscosity that could be a boron doped spin-on glass.

Following the formation of the doped oxide in the evacuated space 46, the bulk material 56 is formed over the remaining portion of the evacuated space as well as the upper surface 58 of the insulating layer 50.

Now the wafer as shown in Step D can be placed in an etchant which discriminates between doped and undoped polycrystalline silicon material. This procedure is fully described in U.S. Pat. No. 3,721,593, entitled "Etch Stop For KOH Anisotropic Etch".

When the wafer is removed from the etchant, it resembles the structure as shown in step F. The substrate 40 having an insulating layer 50 formed thereon with a residual bulk material now identified as 60. The residual material 60 is a combination of the earlier layers 52, 54 and a portion of the polycrystalline layer 56 which has been highly doped by the thermal heating step. As shown in Step E the residual material 60 has an upper surface 62 somewhat below the upper surface 58 of insulating layer 50. Therefore, the steps must be repeated for adding more residual material into the evacuated space 46. Therefore, the spin-on steps for forming layers 52, 54 and 56 are repeated as well as the heating step and the etching step for establishing a surface 64 as shown in Step F which is essentially level with the surface 58 of the insulating layer 50.

In Step F there is shown a substrate 40 having a substantially level surface comprising the upper surface 58 of the insulating layer 50 and the surface 64 of the residual material 60. This wafer as shown in Step F is now ready for additional processing whereby active devices are formed in the regions generally indicated with the numerals 70A and 70B.

EXAMPLE 1

The following is an example of the process steps used in forming the filled moat. (1) A substrate is provided and an insulating layer such as silicon dioxide is formed over the surface by thermal oxidation at a temperature above 900°C for forming an etched barrier. (2) A photoresist layer is formed over the etched stop layer and it is developed and patterned to expose a top surface of the substrate which is to be etched. The substrate is etched in an etchant for establishing the evacuated space in the substrate which is to be filled. The etch stop layer can be stripped and the entire wafer reoxidized or the wafer can be oxidized for establishing the oxide layer in the evacuated space. High viscosity undoped oxide is spun on at 2000–4000 RPMs. Wafers are then backed at a temperature of 200°C. (3) Undoped high viscosity oxide and high viscosity P+ doped oxide are sequentially spun on at a speed of 4000–8000 RPMs and baked at 200°C. A photoresist step is now done to remove the spin-on oxide from areas outside of the grooves and/or moats by 10:1 buffer etch of 10 parts NH$_4$F plus one part HF. The polycrystalline silicon is deposited from a gaseous stream of silane at a temperature of 650°C until a layer of approximately 1$\mu$m to 10$\mu$m is formed. (4) The wafer is placed in a furnace for 30 minutes at a temperature above 1000°C to drive the boron from the spun-on glass into the poly. (5) The wafer is etched in a KOH 2-propanol H$_2$O etchant for removing the undoped poly and leaving behind the residual material which is a combination of polycrystalline silicon and oxide, which is boron doped to a substantially high level. Repeat steps 5 through 9 until the evacuated space is completely filled.

Modifications to the above Example include the following deviations.

An alternate method to refill the moats would be to use only boron doped glass of sufficient viscosity to make the undoped spin-on layer unnecessary.

Another alternate method of refilling the moats is to deposit a boron doped CVD oxide onto the surface instead of spinning on the boron doped glass. This substitution plus the poly and etch cycle could be repeated until a level surface is formed.

Another alternate method would be to spray on the doped boron glass as opposed to spinning or Chemical Vapor Deposition (CVD) methods.

Another alternative would be to establish an undoped oxide layer by one of the above techniques that fills ≈ 95% of the moat and the forming, by one of the above techniques, a boron doped cap oxide that filled the moat ≈ 99% full. The cap oxide would produce a polysilicon cap on the surface only that would effectively seal the moat. In the event that one wishes to fill an evacuated space in a substrate with a filler such as doped oxide alone or a filler of doped oxide plus polycrystalline material or undoped oxide plus doped oxide plus polycrystalline silicon material or polycrystalline material alone, the substrate selected would have to exhibit certain minimum characteristics, i.e., withstand the temperature needed to form the various fillers and be able to withstand the action of the etchant used.

While the invention has been particularly shown and described in reference to the preferred embodiments thereof, it will be understood by those skilled in the art that changes in form and details may be made therein without departing from the spirit and scope of the invention.

What is claimed is:

1. A method for filling an evacuated space on a substrate with an insulating filler;
   providing a substrate having an upper surface and an evacuated space extending from said upper surface into the body of said substrate;
   forming an undoped silicon dioxide layer on said upper surface including said evacuated space;
   forming a highly P+ doped silicon layer on said upper surface including said evacuated space; and
   etchably removing said highly P+ doped silicon dioxide layer positioned on said surface, and leaving said highly doped oxide within said evacuated space.

2. The method as recited in claim 1, wherein said step of forming a layer of undoped silicon dioxide further comprises:
   thermally oxidizing the substrate to form a layer of undoped silicon dioxide.

3. A method for filling an evacuated space with an insulated filler on a substrate of the type which is able to withstand temperatures above 900°C, comprising the steps of:
   providing a substrate having an upper surface and an evacuated space extending from said upper surface into the body of said substrate;
   forming a layer of undoped silicon oxide on said surface including said evacuated space;
   forming a layer of P+ doped silicon oxide on said surface including said evacuated space; and
   etchably removing said P+ doped silicon oxide from said surface and leaving said P+ doped silicon oxide within said evacuated space.

4. The method as recited in claim 3, wherein said step of forming the layer of undoped oxide further comprises:
   forming said layer of undoped oxide by thermally oxidizing said substrate at its oxidation temperature.

5. The method as recited in claim 3, wherein said step of forming the layer of undoped oxide further comprises:
   forming said layer of undoped oxide by chemical vapor deposition.

6. The method as recited in claim 4, wherein said step of forming the layer of P+ doped oxide further comprises:
   forming said layer of P+ doped oxide by spinning said P+ doped oxide onto the surface and evacuated space on said substrate.

7. The method as recited in claim 4, wherein said step of forming the layer of P+ doped oxide further comprises:
   forming said layer of P+ doped oxide by chemical vapor deposition.

8. The method as recited in claim 4, wherein said step of forming the layer of P+ doped oxide further comprises:
   forming said layer of P+ doped oxide by spraying said P+ doped oxide over said upper surface including said evacuated space.

9. The method as recited in claim 5, wherein said step of forming the layer of P+ doped oxide further comprises:
   forming said layer of P+ doped oxide by chemical vapor deposition.

10. The method as recited in claim 5, wherein said step of forming the layer of P+ doped oxide further comprises:
    forming said P+ doped oxide by spinning said P+ doped oxide onto the surface and evacuated space on said substrate.

11. The method as recited in claim 5, wherein said step of forming the layer of P+ doped oxide further comprises:
    forming said layer of P+ doped oxide by spraying said P+ doped oxide over said upper surface including said evacuated space.

* * * * *